(12) United States Patent
Matsumura et al.

(10) Patent No.: US 9,318,470 B2
(45) Date of Patent: Apr. 19, 2016

(54) SEMICONDUCTOR DEVICE

(71) Applicant: Socionext Inc., Kanagawa (JP)

(72) Inventors: Yoichi Matsumura, Kyoto (JP);
Fumihiro Kimura, Nara (JP); Wataru Satou, Osaka (JP); Mitsumi Itou, Kyoto (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 14/814,156

(22) Filed: Jul. 30, 2015

(65) Prior Publication Data

US 2015/0340340 A1 Nov. 26, 2015

Related U.S. Application Data

(63) Continuation of application No. PCT/JP2014/000163, filed on Jan. 15, 2014.

(30) Foreign Application Priority Data

Feb. 5, 2013 (JP) .................. 2013-020155

(51) Int. Cl.
*H01L 23/02* (2006.01)
*H01L 23/34* (2006.01)
(Continued)

(52) U.S. Cl.
CPC ... *H01L 25/0657* (2013.01); *H01L 2224/16225* (2013.01); *H01L 2224/48091* (2013.01); *H01L 2224/48227* (2013.01);
(Continued)

(58) Field of Classification Search
CPC .......... H01L 2224/32145; H01L 2224/16145; H01L 25/0657; H01L 24/97; H01L 2224/1308; H01L 24/11; H01L 2224/48145; B01L 2300/0887
USPC .......................................... 257/686, 723, 777
See application file for complete search history.

(56) References Cited

U.S. PATENT DOCUMENTS 6,096,576 A 8/2000 Corbin et al.
7,145,247 B2 * 12/2006 Kawano .................. H01L 24/73
257/685
(Continued)

FOREIGN PATENT DOCUMENTS

JP 5-29532 A 2/1993
JP 2000-208697 A 7/2000
(Continued)

OTHER PUBLICATIONS

International Search Report issued in International Application No. PCT/JP2014/000163 dated Mar. 18, 2014, with Partial English Translation.
(Continued)

*Primary Examiner* — Hsien Ming Lee
(74) *Attorney, Agent, or Firm* — McDermott Will & Emery LLP (57) ABSTRACT

In a semiconductor device, a lower chip includes a first group of connection terminals provided on a straight region including a corner region and a region extending from the corner region along one side. An upper chip includes a second group of connection terminals. The upper chip and the lower chip are arranged so that the first group of connection terminals at least partially overlaps with the second group of connection terminals. The first group of connection terminals is at least partially electrically connected to the second group of connection terminals.

2 Claims, 13 Drawing Sheets

(51) Int. Cl.
*H01L 23/52* (2006.01)
*H01L 25/065* (2006.01)

(52) U.S. Cl.
CPC ............... *H01L 2224/49171* (2013.01); *H01L 2225/06513* (2013.01); *H01L 2225/06524* (2013.01); *H01L 2225/06527* (2013.01); *H01L 2225/06562* (2013.01); *H01L 2924/15311* (2013.01)

(56) References Cited

U.S. PATENT DOCUMENTS

2004/0080341 A1 4/2004 Sasaki et al.
2005/0121802 A1 6/2005 Kawano et al.
2010/0007014 A1 1/2010 Suzuki et al.

FOREIGN PATENT DOCUMENTS

| JP | 2001-250875 A | 9/2001 |
| JP | 2001-515276 A | 9/2001 |
| JP | 2004-39689 A | 2/2004 |
| JP | 2005-183934 A | 7/2005 |
| JP | 2008-270446 A | 11/2008 |
| JP | 2010-21449 A | 1/2010 |

OTHER PUBLICATIONS

Written Opinion of International Searching Authortiy issued in Application No. PCT/JP2014/000163 dated Mar. 18, 2014, with Partial English Translation.

\* cited by examiner

SEMICONDUCTOR DEVICE

CROSS-REFERENCE TO RELATED APPLICATIONS

This is a continuation of International Application No. PCT/JP2014/000163 filed on Jan. 15, 2014, which claims priority to Japanese Patent Application No. 2013-020155 filed on Feb. 5, 2013. The entire disclosures of these applications are incorporated by reference herein.

BACKGROUND

The present disclosure relates to a semiconductor device, and more particularly relates to a technique for implementing a semiconductor integrated circuit by 3D process technologies.

In recent years, the progress of LSI (large scale integrated circuits) microfabrication processes has enabled highly dense integration of great many components in a chip. As a result, the performance of semiconductor integrated circuits has been improved significantly in terms of miniaturization, multi-functionality, and high response speed, among other things. As the microfabrication processes progress, various problems such as an increase in leakage current involving heat generation of transistors, and wiring delay become more and more serious. Consequently, it has become increasingly difficult to achieve further miniaturization on a two-dimensional plane of a chip. Thus, 3D implementation technologies for stacking a plurality of chips vertically one upon the other have been suggested to overcome those problems.

As such a semiconductor device, disclosed is a chip-on-chip (CoC) type semiconductor device in which two chips are bonded to each other by facedown bonding method with their centers of gravity shifted from each other (see, e.g., Japanese Unexamined Patent Publication No. 2005-183934). Such shifted arrangement of two chips allows for connecting an edge portion of the lower chip to an external device via bonding wires, even if the upper chip is larger in size than the lower chip.

SUMMARY

In a semiconductor device implemented by such 3D process technologies, a connection region in which its upper and lower chips are electrically connected together is provided on each of the upper and lower chips. Functional blocks and other elements are also arranged on the rest of the lower chip other than the connection region. Japanese Unexamined Patent Publication No. 2005-183934 discloses some examples of connection regions of the lower chip.

However, in the semiconductor device of Japanese Unexamined Patent Publication No. 2005-183934, wires for connecting a functional block with another may not be arranged efficiently depending on the location of the connection region on the lower chip. Consequently, it may be necessary to increase the area of the lower chip itself, or a dead space on which no functional blocks may be arranged should be left on the lower chip.

In view of the foregoing, it is therefore an object of the present disclosure to reduce an increase in the area of the lower chip and prevent such a dead space from being left in the semiconductor device.

To achieve this object, the present disclosure provides the following solutions. Specifically, provided is a semiconductor device comprising an upper chip and a lower chip which are arranged to partially overlap with each other in a plan view. The lower chip includes, on a surface thereof facing the upper chip, a first group of connection terminals arranged on a straight region that includes a corner region of the lower chip and a region extending from the corner region along one side of the lower chip. The upper chip includes, on a surface thereof facing the lower chip, a second group of connection terminals. The upper chip and the lower chip are arranged so that the first group of connection terminals at least partially overlaps with the second group of connection terminals. The first group of connection terminals is at least partially electrically connected to the second group of connection terminals.

According to this solution, the upper and lower chips of a semiconductor device are arranged to partially overlap with each other in a plan view. The upper chip includes, on its surface facing the lower chip, a second group of connection terminals. The lower chip includes, on its surface facing the upper chip, a first group of connection terminals. The first group of connection terminals is provided for a straight region including a corner region of the lower chip and a region extending from the corner region along one side of the lower chip. Also, the first and second groups of connection terminals at least partially overlap with each other, and may be electrically connected to each other in this overlapping region. That is, the first group of connection terminals is arranged in line in an edge portion of the lower chip including the corner region along one side of the lower chip. Thus, a dead space will be hardly left between the edge portion and the first group of connection terminals of the lower chip.

Also, even if a plurality of functional blocks are arranged on, e.g., the core region of the lower chip, the first group of connection terminals rarely interferes with the wires connecting those functional blocks with each other. Consequently, those wires can be arranged efficiently, thus reducing an increase in the area of the lower chip.

In one embodiment, the semiconductor device may include a supporting base which is provided adjacent to at least a portion of an outer periphery of the lower chip in a plane direction of the lower chip in order to support the upper chip. This allows the upper chip to be supported stably.

In another embodiment, the supporting base may be spaced apart from the outer periphery of the lower chip. In other words, the supporting base may support just a portion of the upper chip. Accordingly, the amount of the material used to make the supporting base is reduced, thus cutting down the cost of the supporting base.

In still another embodiment, in the semiconductor device, the upper chip may include a plurality of upper chips. In that case, the first group of connection terminals provided for the lower chip includes a plurality of first groups of connection terminals, and each of the second groups of connection terminals of the plurality of upper chips may be electrically connected to any of the plurality of first groups of connection terminals of the lower chip.

According to such an embodiment, if the upper chip is, e.g., a memory circuit, a plurality of memory circuits may be implemented, and thus the memory capacity of the whole semiconductor device is increased.

The present disclosure prevents a semiconductor device from having a lower chip with an increased area and leaving a dead space thereon.

DETAILED DESCRIPTION

<First Embodiment>

Figure 1:
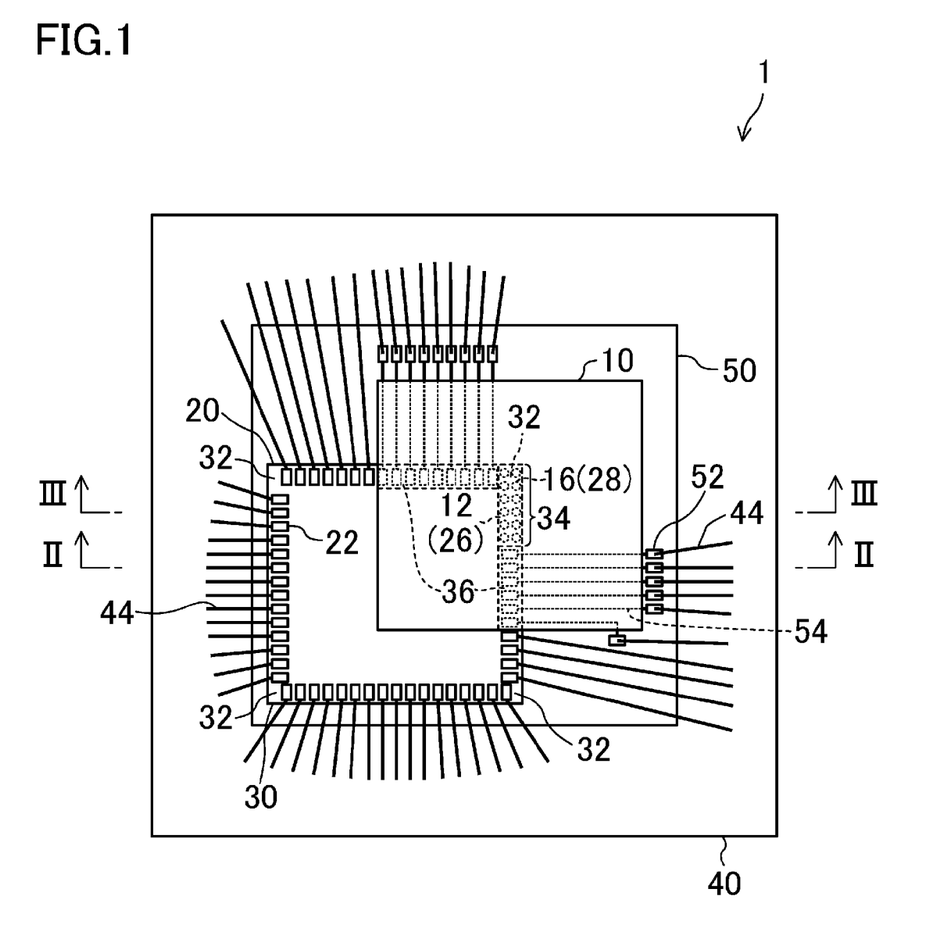
FIG. 1 is a plan view of a semiconductor device according to a first embodiment.
Figure 2:
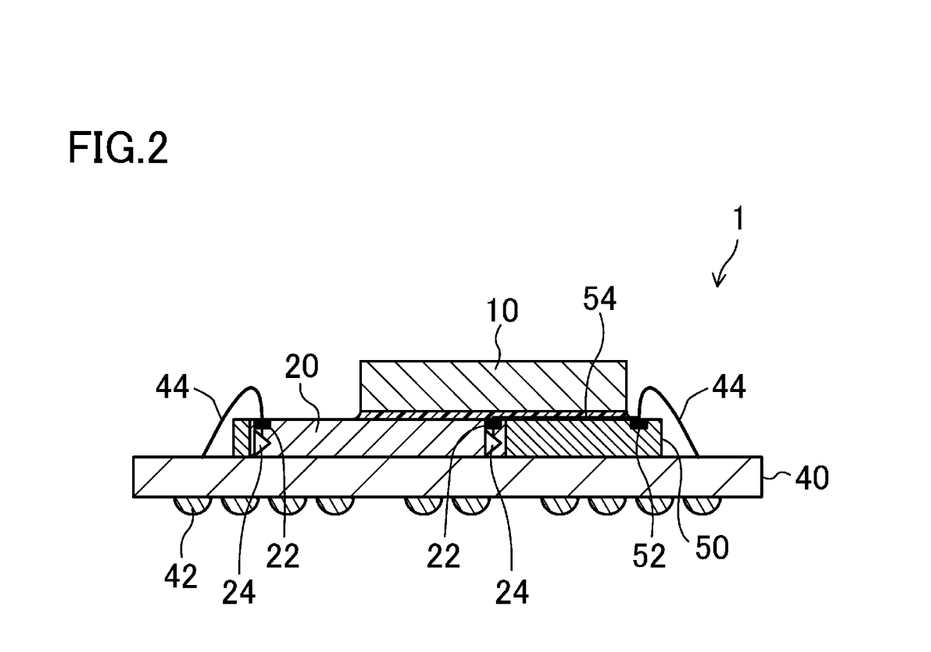
FIG. 2 is a cross-sectional view of the semiconductor device taken along the plane II-II shown in FIG. 1.
Figure 3:
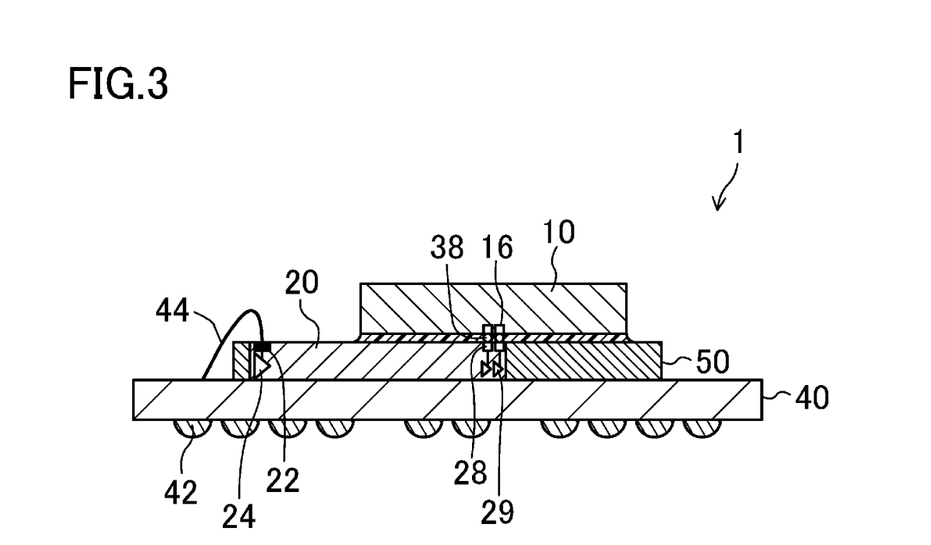
FIG. 3 is a cross-sectional view of the semiconductor device taken along the plane III-III shown in FIG. 1.

FIG. 1 is a plan view of a semiconductor device according to a first embodiment. FIG. 2 is a cross-sectional view of the semiconductor device taken along the plane II-II shown in FIG. 1. FIG. 3 is a cross-sectional view of the semiconductor device taken along the plane III-III in shown FIG. 1. A semiconductor device 1 according to this embodiment is a CoC type semiconductor device, and includes an upper chip 10 and a lower chip 20 as illustrated in FIGS. 1-3. The relationship in size between the upper chip 10 and the lower chip 20 may be defined arbitrarily. The upper chip 10 and the lower chip 20 are arranged so that the lower surface of the upper chip 10 partially overlaps with the upper surface of the lower chip 20. The lower chip 20 is arranged on, e.g., a package substrate 40.

The direction in which interconnect layers are laid on top of one another when chips are stacked one upon the other on the package substrate 40 is defined to be the "upward direction." In this embodiment, the respective surfaces of the upper and lower chips 10 and 20 that are opposed to each other will be hereinafter referred to as "principal surfaces."

An upper group of connection terminals 12 is provided as a second group of connection terminals on a central portion of the principal surface of the upper chip 10. In this embodiment, the upper chip 10 is supposed to be, e.g., a memory circuit such as a dynamic random access memory (DRAM). A specific example of the upper group of connection terminals 12 will be described below with reference to FIGS. 4 and 5.

Figure 4:
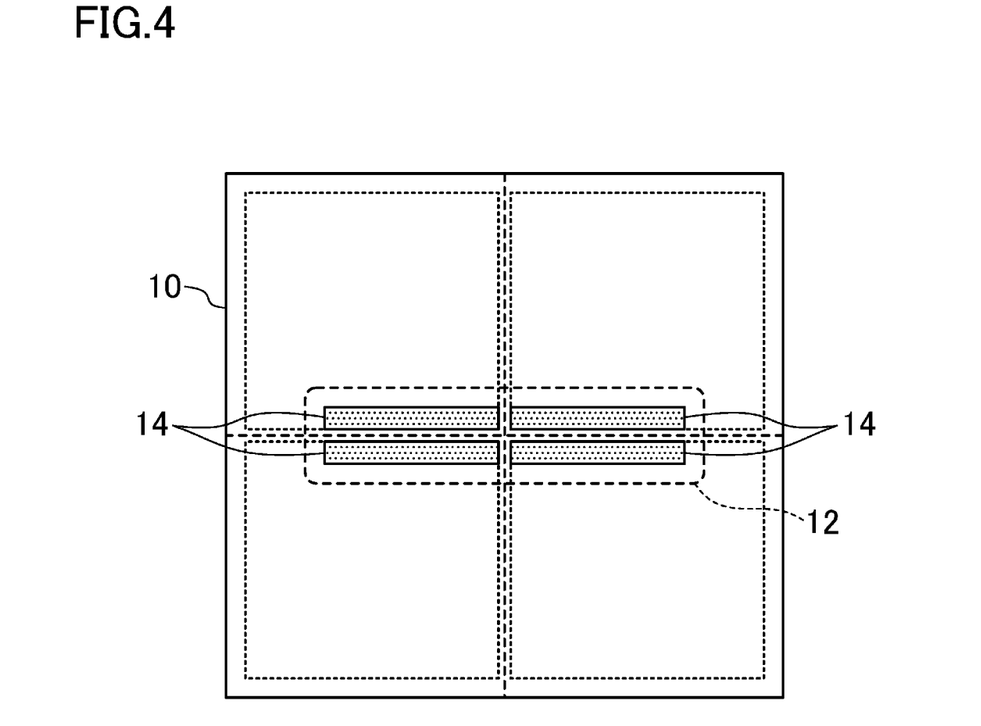
FIG. 4 is a schematic view illustrating an upper chip and a group of connection terminals.
Figure 5:
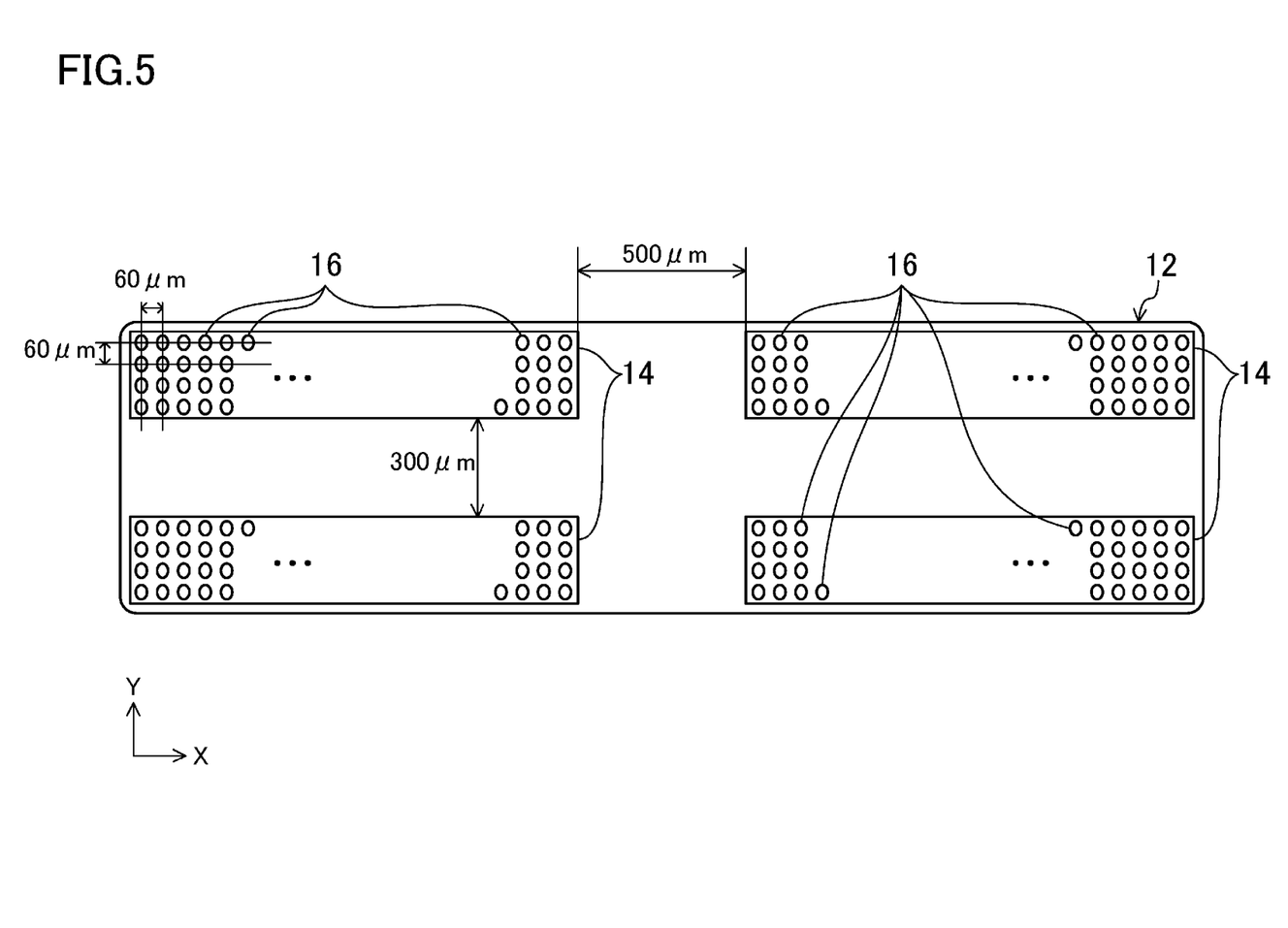
FIG. 5 is an enlarged view of the groups of connection terminals shown in FIG. 4.

FIG. 4 is a schematic view showing the upper chip and the upper group of connection terminals. FIG. 5 is an enlarged view of the upper group of connection terminals shown in FIG. 4.

As illustrated in FIG. 4, the upper group of connection terminals 12 is provided on the central portion of the upper chip 10, and includes, e.g., four subblocks 14 arranged in a matrix pattern. Here, these subblocks 14 each have a rectangular shape. Consequently, the upper group of connection terminals 12 has a rectangular shape as a whole. In addition, as illustrated in FIG. 5, these subblocks 14 are arranged with a gap of 500 μm left in an X-axis direction and with a gap of 300 μm left in a Y-axis direction between them. Moreover, the subblocks 14 each include a plurality of upper terminals 16 arranged in a matrix pattern. For example, each subblock 14 may include fifty upper terminals 16 in the X-axis direction, and four upper terminals 16 in the Y-axis direction. The plurality of upper terminals 16 may be arranged at a pitch of, e.g., 60 μm in each of the X- and Y-axis directions shown in FIG. 5.

In this manner, according to this embodiment, a set of subblocks 14 which are spaced apart from each other by a gap that is at most a predetermined number times (e.g., at most 10×) as long as the pitch at which the upper terminal 16 are arranged is defined as the upper group of connection terminals 12. Thus, even if there is a set of terminals on the upper chip 10 but if the distance from an arbitrary one of the subblocks 14 to that set is more than a predetermined number of times as long as the pitch of the upper terminals 16, then that set (and the terminals included in the set) do not belong to the upper group of connection terminals 12.

The upper group of connection terminals 12 is located in a region around the center of the upper chip 10, e.g., a predetermined region including the center of gravity of the upper chip 10. In this embodiment, this region is defined to be the central portion of the upper chip 10. If the upper chip 10 is a DRAM, such arrangement of the upper group of connection terminals 12 at the central portion of the upper chip 10 makes the distances between the upper group of connection terminals 12 and a plurality of memory cells in the DRAM more uniform, thus improving the characteristics, such as the operation speed, of the DRAM. Therefore, the upper group of connection terminals 12 is preferably arranged at such a location where the characteristics of the DRAM do not deteriorate.

Next, the lower chip 20 will be described with reference to FIGS. 1-3. The lower chip 20 includes a plurality of IO pads 22, a plurality of IO cells 24, and a lower group of connection terminals 26 as a first group of connection terminals. In this embodiment, the lower chip 20 is supposed to be, e.g., a logic circuit which exchanges electrical signals with the DRAM. Although not shown, functional blocks and other elements are also arranged on the principal surface of the lower chip 20.

The plurality of IO pads 22 are arranged on a peripheral region 30 on the principal surface of the lower chip 20. The plurality of IO pads 22 are electrically connected, via bonding wires 44, to balls 42 provided on the lower surface of the package substrate 40. In the peripheral region 30 of the lower chip 20, the plurality of IO cells 24 are arranged under the plurality of IO pads 22, i.e., inside the lower chip 20, and electrically connected to their associated IO pads 22.

The lower group of connection terminals 26 is provided on a straight region 34 on the principal surface of the lower chip 20. The straight region 34 includes a corner region 32 of the lower chip 20 and a region extending from the corner region 32 along one side of the lower chip 20. The straight region 34 is a region including a portion of the peripheral region 30 on which the IO pads 22 (or the IO cells 24) of the lower chip 20 are arranged. The lower group of connection terminals 26 also includes a plurality of lower terminals 28. The upper group of connection terminals 12 overlaps with the lower group of connection terminals 26 in a plan view, and the upper and lower terminals 16 and 28 are electrically connected to each other via, e.g., a bump 38. In addition, as illustrated in FIG. 3, IO cells 29 electrically connected to the upper terminals 16 are provided under the lower terminal 28.

Around the outer periphery of the lower chip 20, provided is a resin expansion portion 50, which is made of, e.g., a resin material and which serves as a supporting base that supports the upper chip 10. The resin expansion portion 50 is continuous with the outer periphery of the lower chip 20 in the plane direction of the lower chip 20, and is level with the lower chip 20. An underfill made of, e.g., an insulating resin is injected into the gap between the lower chip 20 and the upper chip 10 and between the resin expansion portion 50 and the upper chip 10, which increases the strength against the impact on the upper and lower chips 10 and 20.

A plurality of expansion IO pads 52 are provided outside of the outer periphery of the upper chip 10 on the resin expansion portion 50. The plurality of expansion IO pads 52 are each electrically connected to a ball 42 via a bonding wire 44. Wiring extension regions 36 are also defined on the principal surface of the lower chip 20. The wiring extension regions 36 are provided for a region where the upper chip 10 overlaps with the lower chip 20, more particularly, on the peripheral region 30 except the straight region 34. These expansion IO pads 52 are electrically connected to the IO pads 22 arranged on the wiring extension regions 36 via on-resin wires 54.

No bonding wires 44 can be directly connected to the IO pads 22 provided on the wiring extension region 36 due to their locations with respect to the upper and lower chips 10 and 20. For this reason, in this embodiment, the on-resin wires 54 are extended from the IO pads 22 on the wiring extension region 36 to the expansion IO pads 52, which are then connected to the bonding wires 44 so that the IO pads 22 on the wiring extension region 36 can be indirectly connected with the bonding wires 44.

Next, the peripheral region 30, the corner region 32, and the straight region 34 on the lower chip 20 of this embodiment will be described by way of specific examples.

Figure 6A:
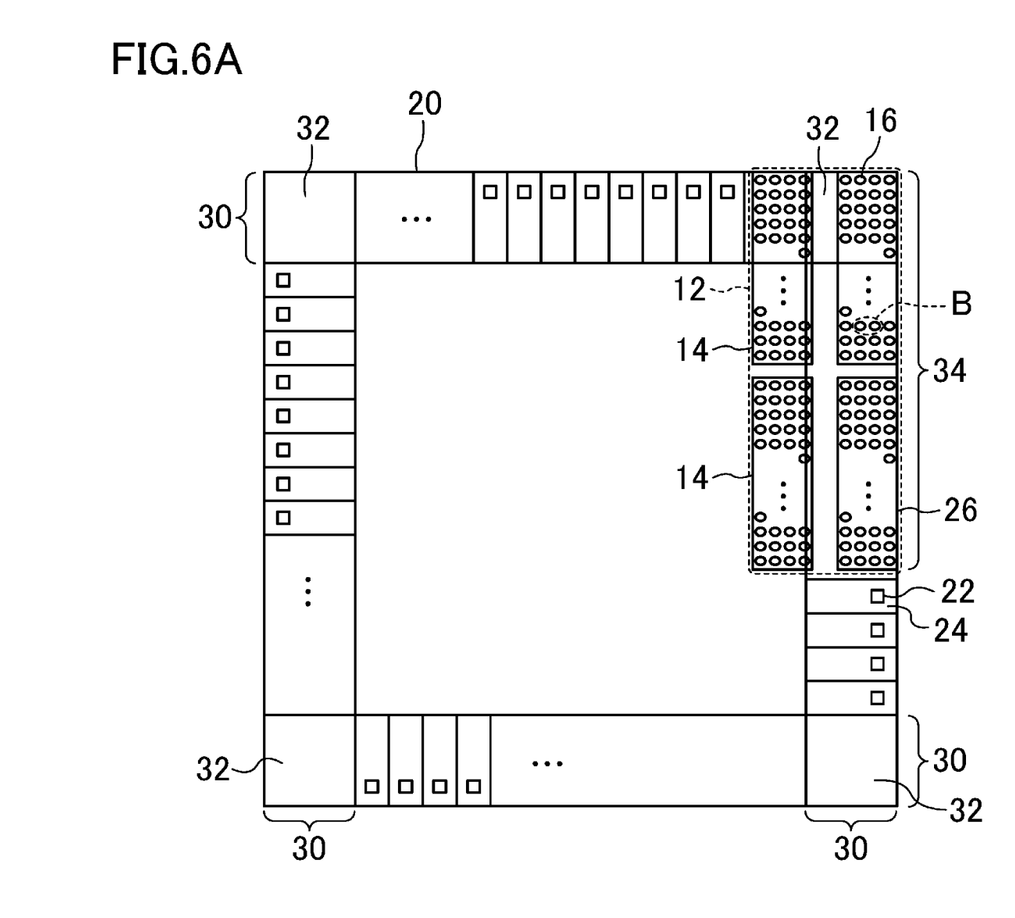
FIG. 6A is a schematic view of a semiconductor device according to a first embodiment.
Figure 6B:
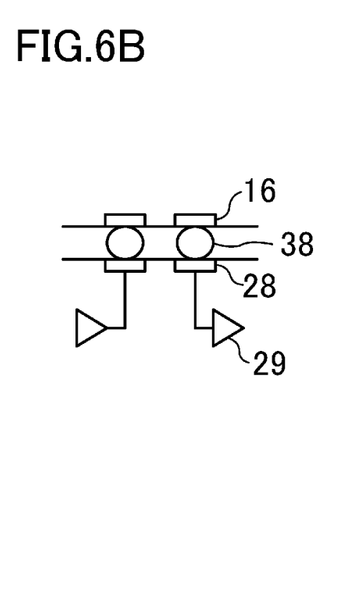
FIG. 6B is an enlarged cross-sectional view illustrating a part of the semiconductor device.

FIG. 6A is a schematic view of a semiconductor device according to the first embodiment. FIG. 6B is an enlarged cross-sectional view of a portion indicated by the reference character B in FIG. 6A. The reference character B in FIG. 6A denotes a portion of the region in which the upper group of connection terminals 12 overlaps with the lower group of connection terminals 26. In FIG. 6A, illustration of the upper chip 10 is omitted so that the upper group of connection terminals 12 is shown. As illustrated in FIG. 6A, the peripheral region 30 of the lower chip 20 is a region on which the IO cells 24 (or the IO pads 22) are arranged, and a region which is located around the outer periphery of the lower chip 20. The corner region 32 is a portion of the peripheral region 30 including any of four corners of the lower chip 20. The straight region 34 is a region including the corner region 32 and the region extending from the corner region 32 along one side of the lower chip 20. The IO cells 24 and the IO pads 22 may be arranged on the corner region 32.

The upper group of connection terminals 12 is also located so as to overlap with the straight region 34 of the lower chip 20, i.e., to overlap with the lower group of connection terminals 26. In FIG. 6A, the area of the lower group of connection terminals 26 (the area of the straight region 34) is smaller than that of the upper group of connection terminals 12. However, the relationship in size between these areas may be defined arbitrarily. In the region where the upper group of connection terminals 12 overlaps with the lower group of connection terminals 26, an upper terminal 16 belonging to the upper group of connection terminals 12 is electrically connected to a lower terminal 28 belonging to the lower group of connection terminals 26 via a bump 38 as illustrated in FIG. 6B. This enables exchange of signals between the IO cell 29 and the upper terminal 16. To electrically connect the upper and lower groups of connection terminals 12 and 26 together at as short a distance as possible, the upper and lower groups of connection terminals 12 and 26 preferably at least partially overlap with each other in a region in a plan view, and at least partially electrically connected together in that overlapping region. This is because the shorter the distance, the higher quality of signals or voltages between the upper chip 10 as a DRAM and the lower chip 20 as a logic circuit can be maintained, and eventually, the higher the reliability of the semiconductor device 1 can be.

As can be seen from the foregoing, according to this embodiment, the lower group of connection terminals 26 is arranged on the straight region 34 including the corner region 32 of the lower chip 20. This thus allows for preventing a dead space from being left on the lower chip 20, and also avoiding an increase in the area of the lower chip 20. This respect will be described in comparison with the technique of Japanese Unexamined Patent Publication No. 2005-183934, which is a conventional technique.

Figure 13:
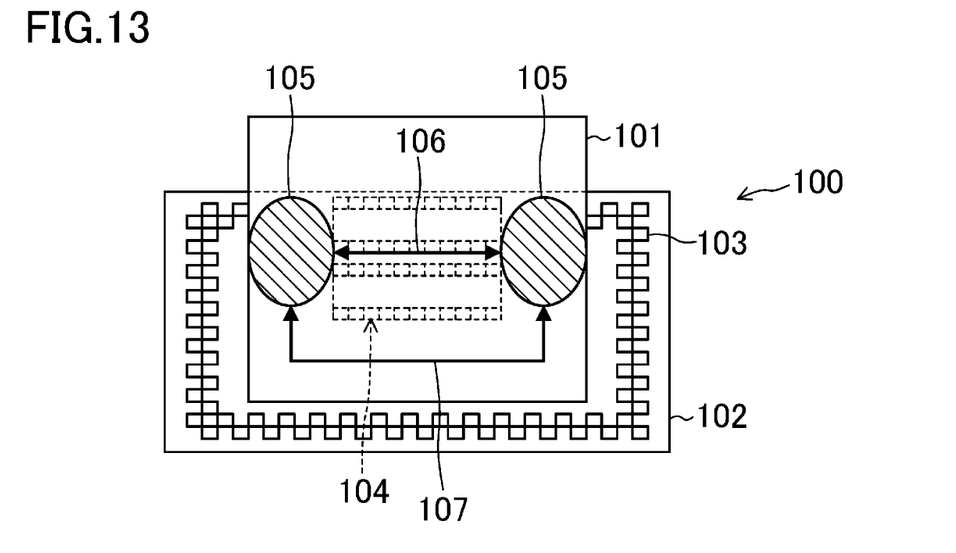
FIG. 13 is a plan view showing an example of a conventional semiconductor device.
Figure 14:
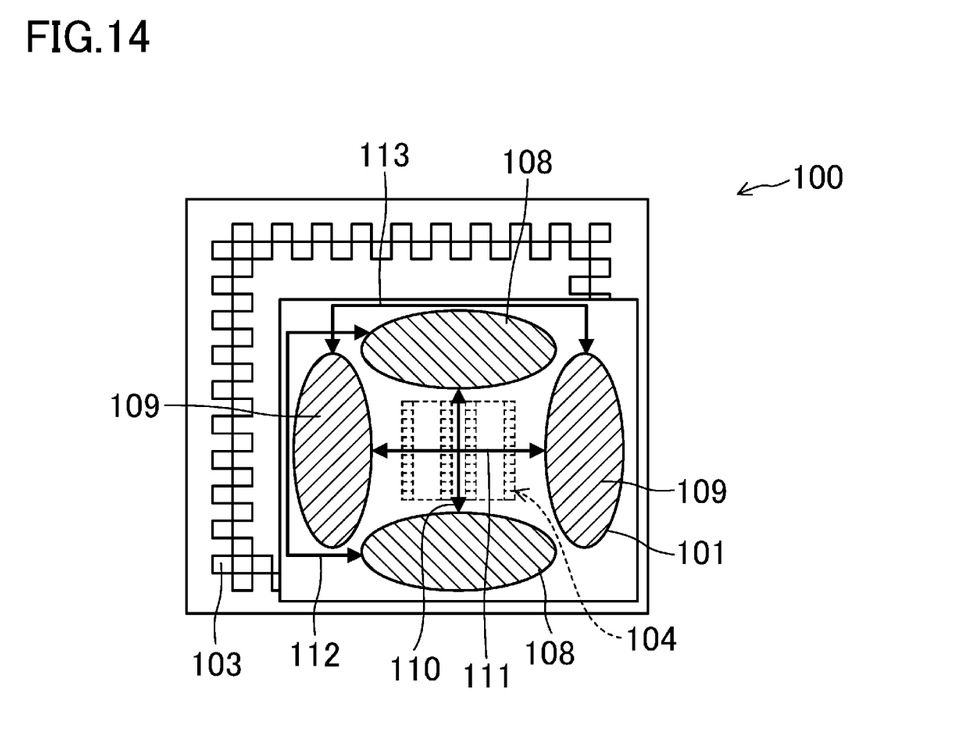
FIG. 14 is a plan view showing another example of the conventional semiconductor device.
Figure 15:
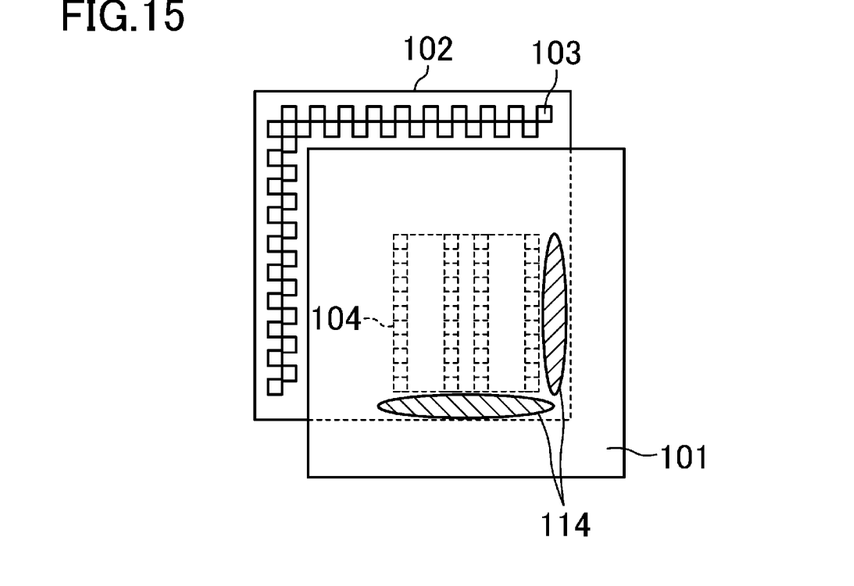
FIG. 15 is a plan view showing another example of the conventional semiconductor device.

FIGS. 13-15 illustrate configurations for semiconductor devices shown as examples in Japanese Unexamined Patent Publication No. 2005-183934. As illustrated in FIGS. 13-15, in the semiconductor device 100 of Japanese Unexamined Patent Publication No. 2005-183934, an upper chip 101 overlaps with a lower chip 102 with their centers of gravity shifted from each other. Japanese Unexamined Patent Publication No. 2005-183934 also discloses some exemplary layout patterns for IO pads 103 on the lower chip 102, and a bump area 104 for connecting the upper chip 101 to the lower chip 102 with respect to the semiconductor device 100.

As illustrated in FIGS. 13 and 14, on the lower chip 102, functional blocks 105, 108, 109, and other elements are arranged between the IO pads 103 and the bump area 104. These functional blocks 105, 108, and 109 are connected together via wires, which are preferably as short as possible.

Figure 16:
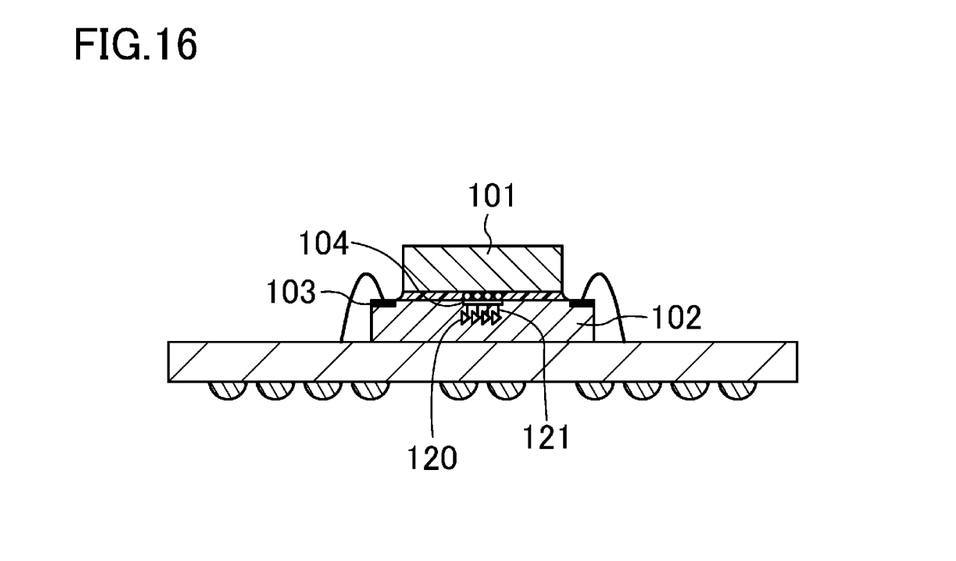
FIG. 16 is a cross-sectional view of an exemplary conventional semiconductor device.

Thus, in FIG. 13, the functional blocks 105 should be connected together via a wire 106, and in FIG. 14, the functional blocks 108 should be connected together via a wire 110, and the functional blocks 109 should be connected together via a wire 111. However, it is difficult to make such connections. Specifically, as illustrated in FIG. 16, internal IO cells 120 for exchanging a plurality of signals with the upper chip 101 are provided under the bump area 104 of the lower chip 102. Also, vias 121 for connecting upper and lower interconnect layers of the lower chip 102 are provided between the bump area 104 and the internal IO cells 120 of the lower chip 102. There are as many vias 121 as signals, and the vias 121 are arranged at a narrow pitch. Consequently, it is difficult to extend the wires 106, 110, and 111 under the bump area 104, i.e., between the vias 121, in order to connect one of the functional blocks 105, 108, 109 to the other.

Thus, in FIG. 13, the functional blocks 105 need to be connected together via the wire 107 instead of the wire 106 and in FIG. 14, the functional blocks 108, 109 need to be connected together via the wires 112 and 113 instead of the wires 110 and 111, respectively, bypassing the bump area 104. Such connections not only increase the wire lengths but also interfere with the layout of other functional blocks. As a result, this may cause an increase in the area of the lower chip 102.

In addition, if the bump area 104 is defined as illustrated in FIG. 15, narrow spaces on which no functional blocks or other elements can be arranged are left such as regions 114 between the bump area 104 and edge portions of the lower chip 102. Such spaces become dead spaces.

As can be seen, according to the technique shown as an example in Japanese Unexamined Patent Publication No. 2005-183934, an appropriate location of the bump area 104 and a region in which the vias 121 are present are not taken into consideration. This may cause an increase in the area of the lower chip 102 or allow a dead space to be left on the lower chip 102 depending on the location of the bump area 104.

In contrast, according to this embodiment, in the semiconductor device 1 in which the upper chip 10 partially overlaps with the lower chip 20 in a plan view, the upper group of connection terminals 12 of the upper chip 10 is arranged to overlap with, and be electrically connected to, the lower group of connection terminals 26 of the lower chip 20. The lower group of connection terminals 26 is also arranged on the straight region 34 including the corner region 32 on the principal surface of the lower chip 20. Consequently, a dead space is hardly left on the principal surface of the lower chip 20. Also, even if a plurality of functional blocks are arranged on a core region of the lower chip 20 other than the peripheral region 30, wires for connecting those functional blocks together need not be bypassed, because the lower group of connection terminals 26 is located on a portion of the outer peripheral edge of the lower chip 20 including the corner region 32 thereof.

Figure 7:
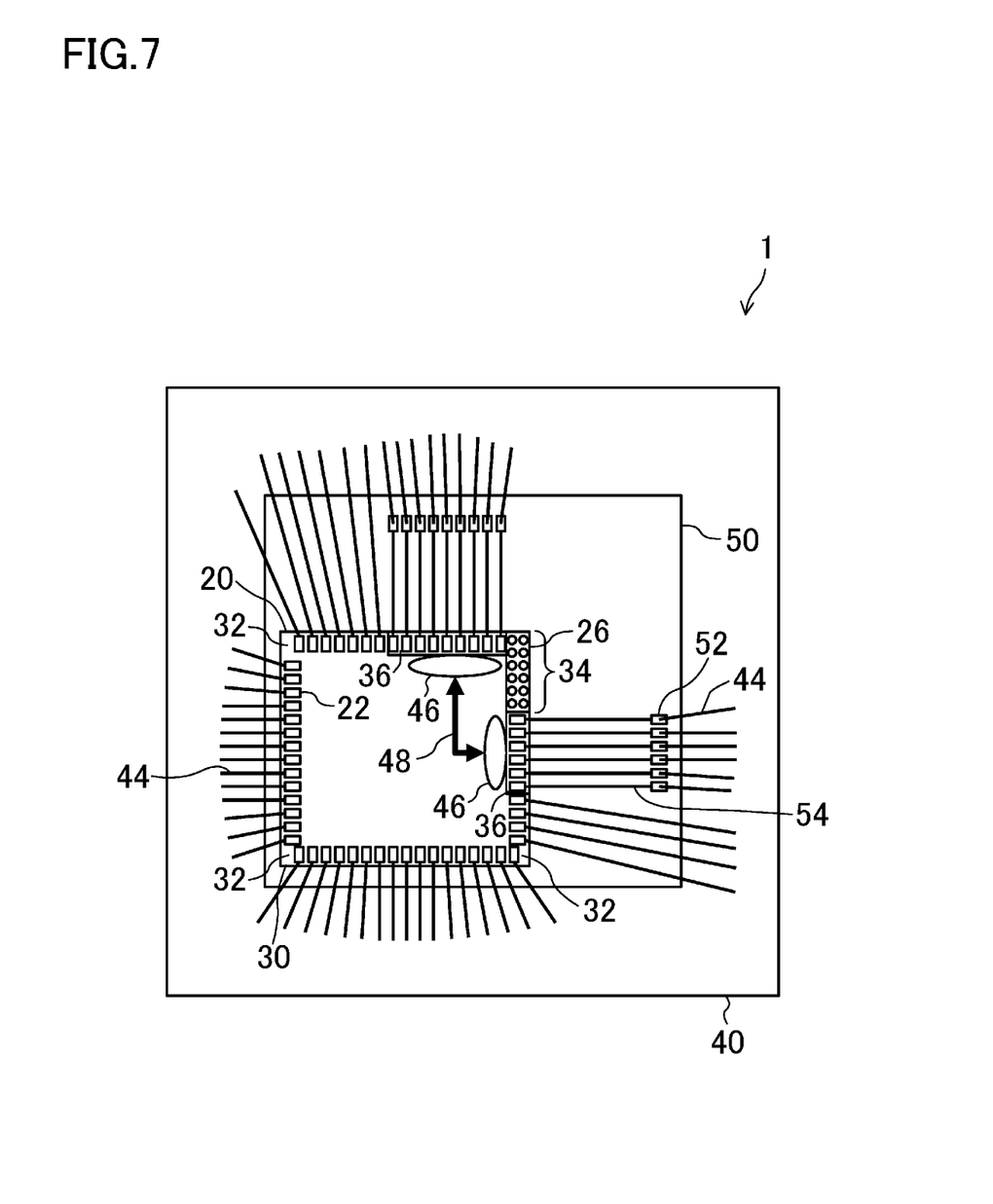
FIG. 7 illustrates the functions and effects of the semiconductor device according to the first embodiment.

FIG. 7 illustrates functions and effects achieved by the semiconductor device of this embodiment. In FIG. 7, illustration of the upper chip 10 is omitted for the sake of convenience. Functional blocks 46 arranged as illustrated in FIG. 7 can be easily connected together, because it is unnecessary to bypass the wire 48 that connects these functional blocks 46 together. That is, the wire 48 that connects together the functional blocks 46 provided at any arbitrary locations on the core region can have the shortest length if the lower group of connection terminals 26 is provided on the straight region 34 including the corner region 32 of the lower chip 20 as is done in this embodiment. Accordingly, an increase in the area of the lower chip 20 can be reduced.

As can be seen from the foregoing, this embodiment allows for reducing the area of the lower chip 20 while eliminating a dead space from the lower chip 20.

Figure 8:
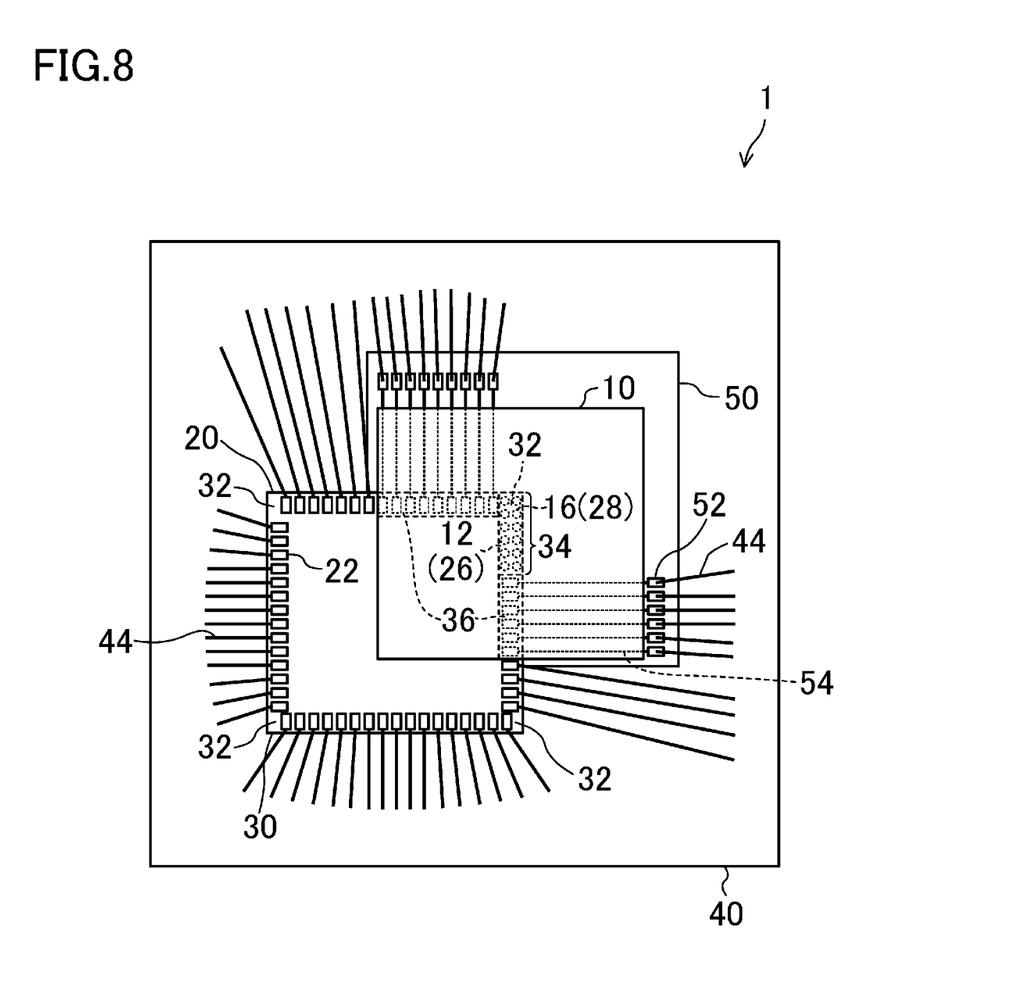
FIG. 8 is a plan view showing another example of a resin expansion portion according to the first embodiment.

Note that the resin expansion portion 50 does not have to be formed continuously so as to surround the entire outer periphery of the lower chip 20. Alternatively, as illustrated in FIG. 8, the resin expansion portion 50 may also be formed so as to be continuous with only a portion of the lower chip 20. In that case, a reduced amount of resin material is required, and thus, the manufacturing cost of the semiconductor device 1 can be reduced.

<Second Embodiment>

Figure 9:
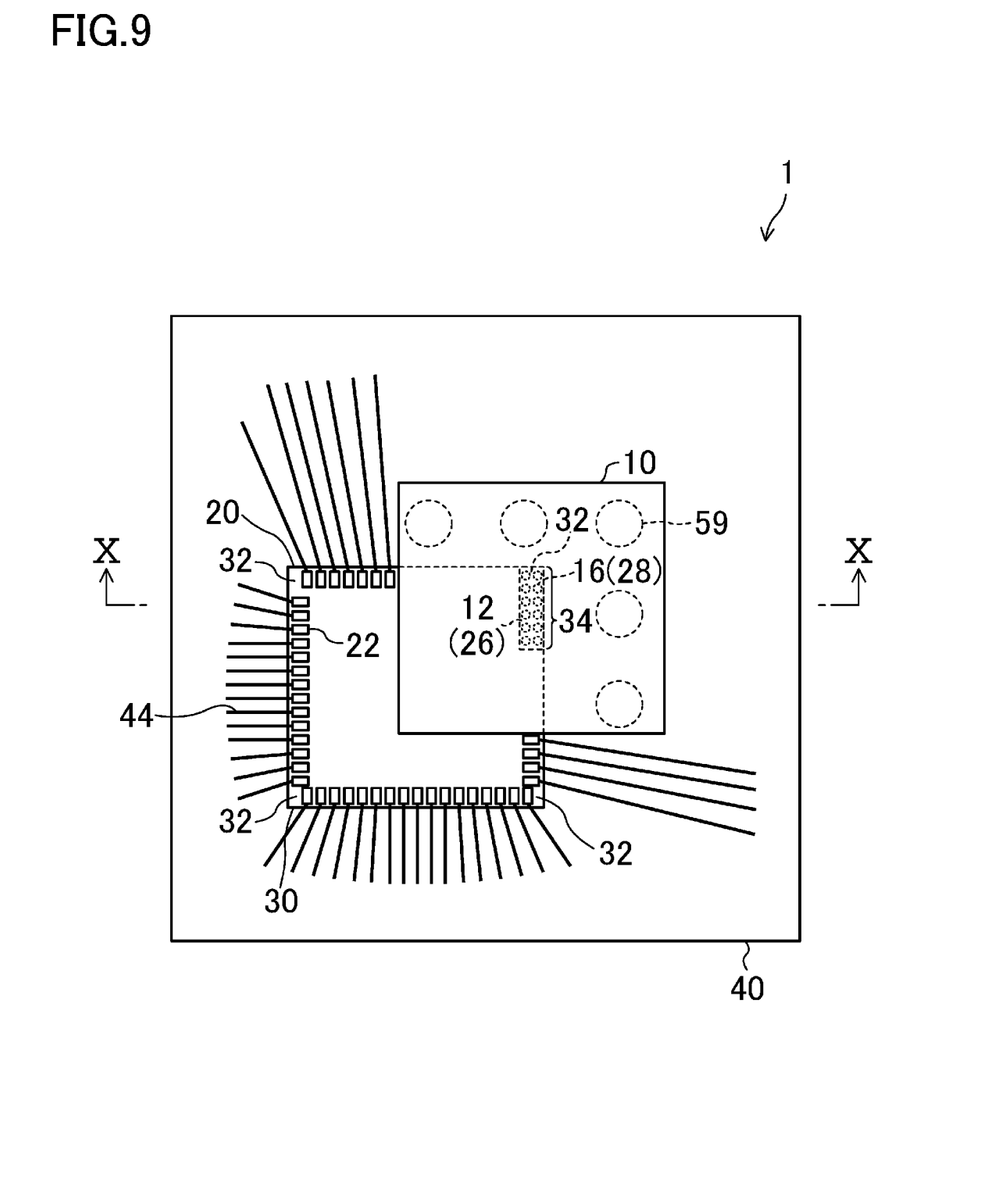
FIG. 9 is a plan view showing a variation of a semiconductor device according to a second embodiment.
Figure 10:
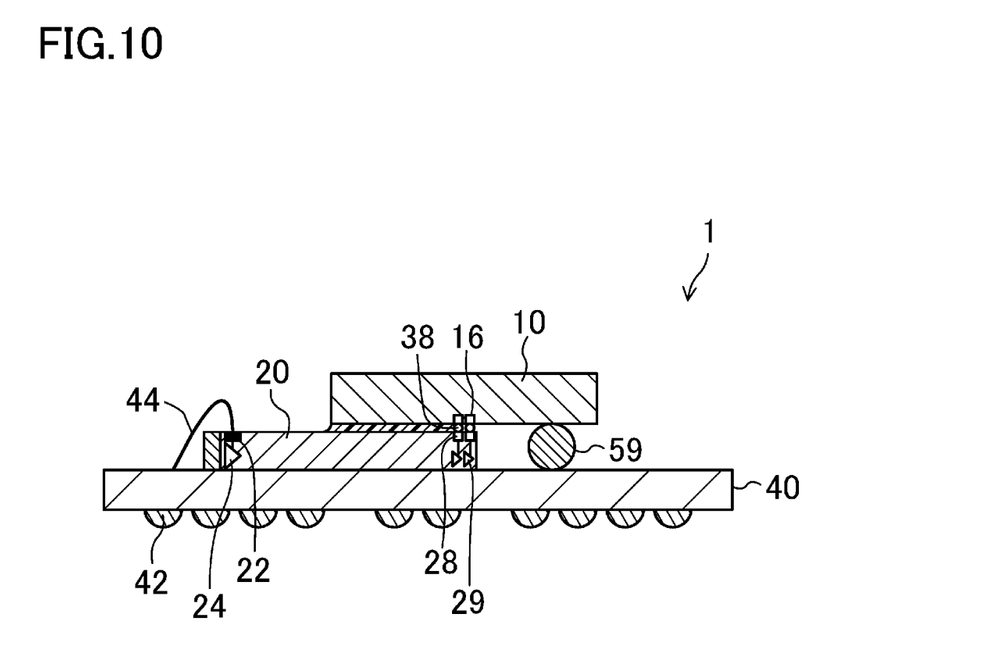
FIG. 10 is a cross-sectional view of the semiconductor device taken along the plane X-X shown in FIG. 9.

FIG. 9 is a plan view of a semiconductor device according to a second embodiment. FIG. 10 is a cross-sectional view of the semiconductor device taken along the plane X-X shown in FIG. 9.

In this embodiment, supporting bases 59 to support an upper chip 10 are arranged adjacent to a lower chip 20 in the plane direction of the lower chip 20.

Specifically, as illustrated in FIGS. 9 and 10, the upper chip 10 is supported by, e.g., five spherical supporting bases 59 provided on a package substrate 40. Each of the supporting bases 59 is spaced apart from the outer periphery of the lower chip 20 in the plane direction of the lower chip 20.

Thus, according to this embodiment, a reduced amount of material is needed to make the supporting bases 59, and thus, the manufacturing cost of the semiconductor device 1 can be cut down.

In this embodiment, the shape, number, or material of the supporting bases 59 may be determined arbitrarily as long as the supporting bases 59 can support the upper chip 10 stably. The supporting bases 59 may also be arranged at any arbitrary locations.

In this embodiment, the expansion IO pads 52 and on-resin wires 54 illustrated in FIG. 1 are unnecessary, and thus the IO pads 22 on the wiring extension region 36 are not necessary, either.

<Third Embodiment>

Figure 11:
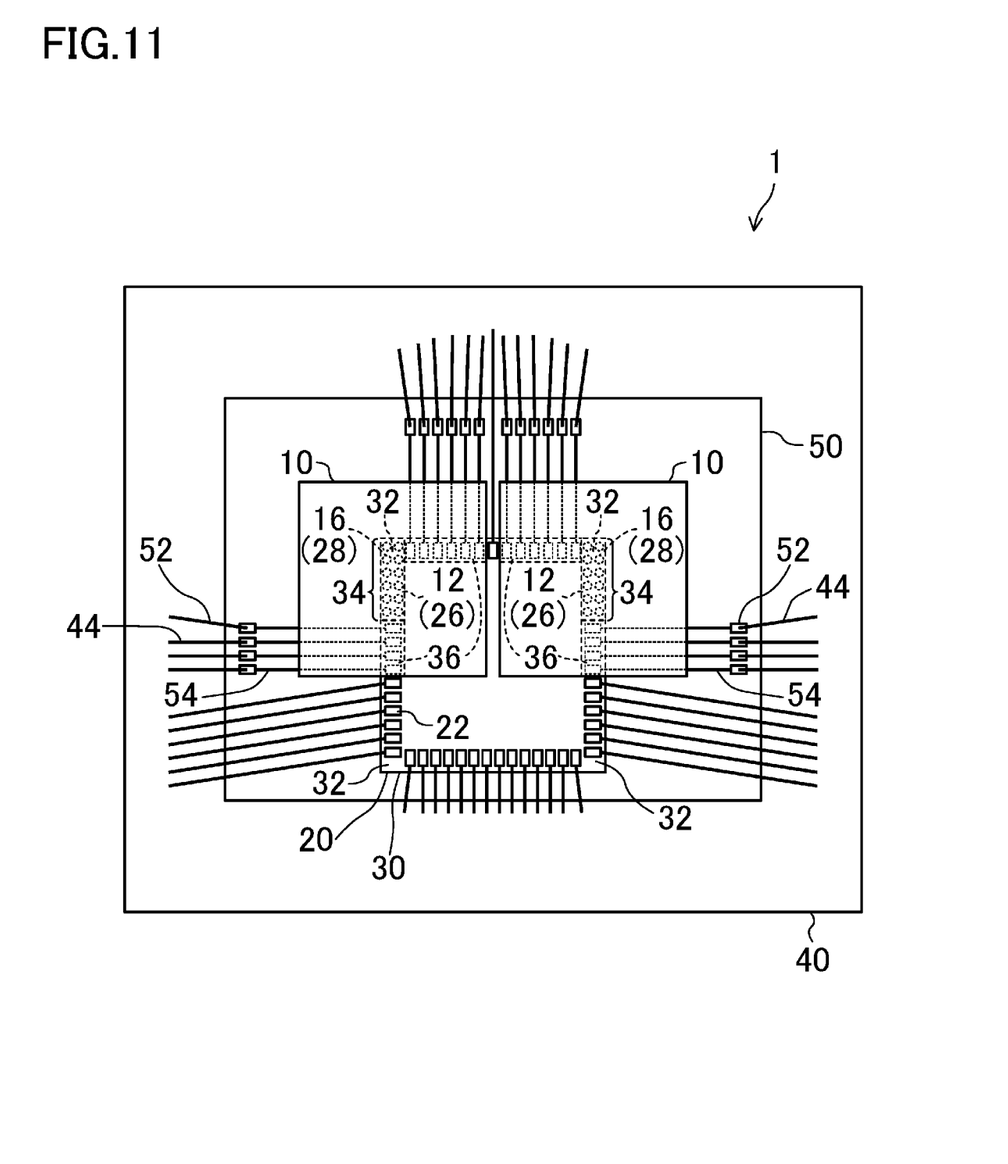
FIG. 11 is a plan view showing a variation of a semiconductor device according to a third embodiment.

FIG. 11 is a plan view of a semiconductor device according to a third embodiment. The semiconductor device 1 of this embodiment includes, e.g., two upper chips 10. Two lower groups of connection terminals 26 are also provided on the principal surface of a lower chip 20 for the respective upper chips 10. If a plurality of upper chips 10 are arranged in this manner, those chips 10 need to be arranged so as not to overlap with each other.

Thus, according to this embodiment, the memory capacity of the whole semiconductor device 1 can be increased where the upper chips 10 are DRAMs.

The plurality of upper chips 10 may have either the same size or mutually different sizes. Also, the number of the lower groups of connection terminals 26 provided on the lower chip 20 does not have to be the same as that of the upper chips 10. Also, in this embodiment, the resin expansion portion 50 may be arranged so as to be continuous with only a portion of the lower chip 20.

In the first and third embodiments described above, the supporting base for the upper chip 10 is supposed to be the resin expansion portion 50 made of a resin material. However, any material may be used for the supporting base.

In the first and third embodiments, the supporting base for the upper chip 10 does not have to be continuous with the outer periphery of the lower chip 20, but may be provided adjacent to the outer periphery.

In the embodiments described above, the upper chip 10 is supposed to be a DRAM, and the lower chip 20 a logic circuit. However, those chips 10 and 20 may be semiconductor integrated circuits with any other functions. Specifically, those chips may have any other configuration as long as the upper chip 10 is arranged so as to partially overlap with the lower chip 20 in a plan view, the upper group of connection terminals 12 is provided on the central portion of the upper chip 10, the lower group of connection terminals 26 is provided on the straight region 34 on the lower chip 20, and the upper group of connection terminals 12 is electrically connected to the lower group of connection terminals 26 at the shortest possible distance.

Also, in the embodiments described above, the lower chip 20 is supposed to be provided on the package substrate 40. However, a lead frame method may be adopted. In that case, the lower chip 20 and the resin expansion portion 50 may be arranged on a die pad.

Furthermore, in the embodiments described above, the upper group of connection terminals 12 of the upper chip 10 may be electrically connected to the lower group of connection terminals 26 of the lower chip 20 by using, e.g., a pillar instead of the bump 38.

Figure 12:
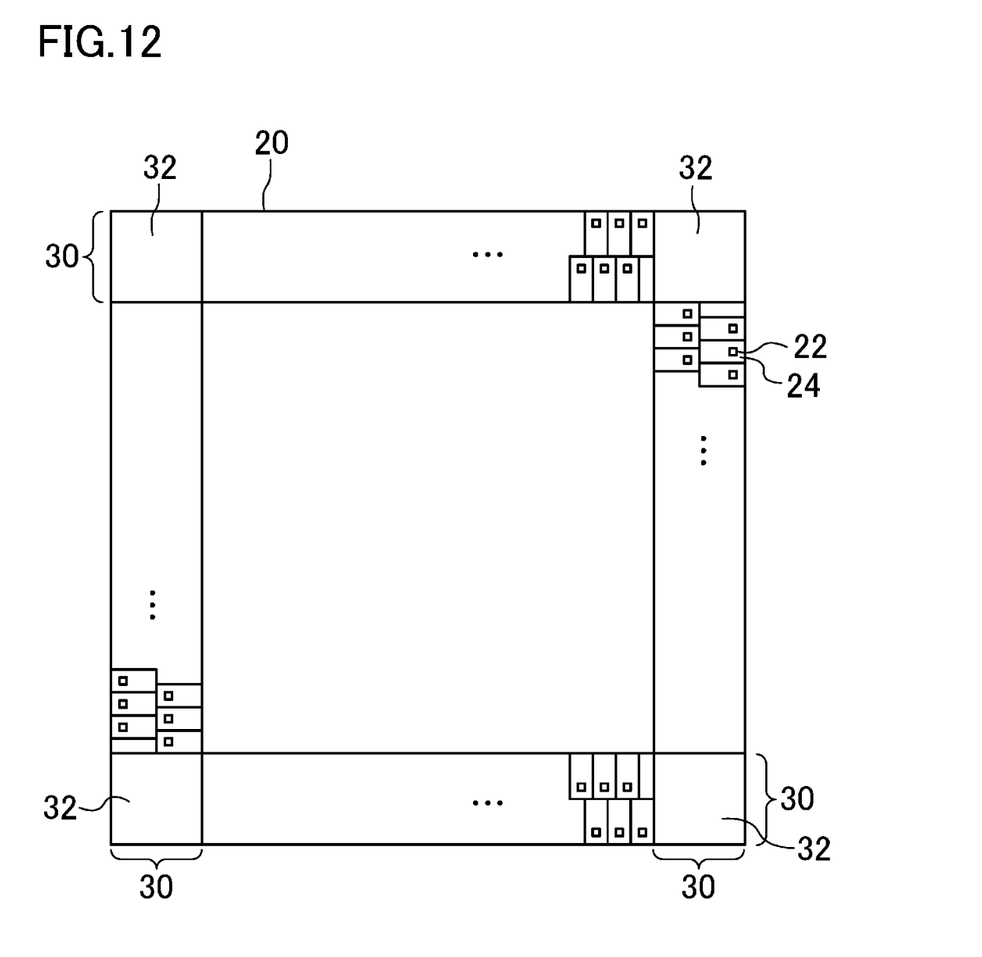
FIG. 12 is a schematic view showing a variation of IO cells arranged on a lower chip.

Furthermore, in the embodiments described above, the IO cells 24 are supposed to be arranged on the lower chip 20 as illustrated in FIG. 6A. However, the IO cells 24 may be arranged in a hound's tooth check as illustrated in, e.g., FIG. 12. That is to say, the IO cells 24 may be arranged on the peripheral region 30 of the lower chip 20 in any arbitrary pattern.

Furthermore, in the embodiments described above, the straight region 34 may include two adjacent corner regions 32 of the lower chip 20. In other words, the lower group of connection terminals 26 may be arranged along one entire side of the lower chip 20 including two adjacent corner regions 32 thereof.

The semiconductor device of the present disclosure uses the lower chip efficiently enough to integrate a far greater number of elements even more densely, and thus is useful for a memory and other storage devices that need to have a greater storage capacity.

What is claimed is:

1. A semiconductor device comprising:
   an upper chip and a lower chip, which are arranged to partially overlap with each other in a plan view; and
   a supporting base which is provided adjacent to at least a portion of an outer periphery of the lower chip in a plane direction of the lower chip and supports the upper chip, wherein
   the lower chip includes, on a surface thereof facing the upper chip, a first group of connection terminals arranged on a straight region that includes a corner region of the lower chip and a region extending from the corner region along one side of the lower chip,
   the upper chip includes, on a surface thereof facing the lower chip, a second group of connection terminals,
   the upper chip and the lower chip are arranged so that the first group of connection terminals at least partially overlaps with the second group of connection terminals,
   the first group of connection terminals is at least partially electrically connected to the second group of connection terminals, and
   the supporting base is a resin expansion portion which is continuous with the outer periphery of the lower chip and made of a resin material, wherein
   the resin expansion portion is arranged in a range covering an outer periphery of the upper chip, and
   the semiconductor device further includes:
   an extension IO pad arranged on the resin expansion portion outside of the outer periphery of the upper chip, and
   a wire to electrically connect the extension IO pad to an IO cell that is arranged in a peripheral region of the lower chip, the peripheral region forming part of a region where the upper chip overlaps with the lower chip and excluding the straight region.

2. A semiconductor device comprising:
   an upper chip and a lower chip, which are arranged to partially overlap with each other in a plan view; and
   a supporting base which is provided adjacent to at least a portion of an outer periphery of the lower chip in a plane direction of the lower chip and supports the upper chip, wherein
   the lower chip includes, on a surface thereof facing the upper chip, a first group of connection teiminals arranged on a straight region that includes a corner region of the lower chip and a region extending from the corner region along one side of the lower chip,
   the upper chip includes, on a surface thereof facing the lower chip, a second group of connection terminals,
   the upper chip and the lower chip are arranged so that the first group of connection terminals at least partially overlaps with the second group of connection terminals,
   the first group of connection terminals is at least partially electrically connected to the second group of connection terminals, and
   the supporting base is a resin expansion portion which is continuous with the outer periphery of
   the lower chip and made of a resin material, wherein
   the upper chip includes a plurality of upper chips,
   the first group of connection terminals includes a plurality of first groups of connection terminals provided for the lower chip, and
   the second group of connection terminals on each of the plurality of upper chips is electrically connected to any of the plurality of first groups of connection terminals of the lower chip.

\* \* \* \* \*